(12) United States Patent
Toyonaka et al.

(10) Patent No.: US 12,477,839 B2
(45) Date of Patent: Nov. 18, 2025

(54) SEMICONDUCTOR PHOTODETECTOR

(71) Applicant: Lumentum Operations LLC, San Jose, CA (US)

(72) Inventors: Takashi Toyonaka, Yokohama (JP); Hiroshi Hamada, Yokohama (JP); Ryu Washino, Yokohama (JP); Shigetaka Hamada, Sagamihara (JP); Suguru Kato, Sagamihara (JP)

(73) Assignee: Lumentum Operations, San Jose, CA (US)

( * ) Notice: Subject to any disclaimer, the term of this patent is extended or adjusted under 35 U.S.C. 154(b) by 415 days.

(21) Appl. No.: 18/127,423

(22) Filed: Mar. 28, 2023

(65) Prior Publication Data
US 2024/0213389 A1  Jun. 27, 2024

(30) Foreign Application Priority Data

Dec. 21, 2022 (JP) .................................. 2022-204354
Feb. 8, 2023 (JP) .................................. 2023-017340

(51) Int. Cl.
| H10F 30/223 | (2025.01) |
| H10F 77/124 | (2025.01) |
| H10F 77/14 | (2025.01) |
| H10F 77/20 | (2025.01) |

(52) U.S. Cl.
CPC ....... *H10F 30/223* (2025.01); *H10F 77/1248* (2025.01); *H10F 77/147* (2025.01); *H10F 77/206* (2025.01)

(58) Field of Classification Search
CPC .. H10F 30/223; H10F 77/1248; H10F 77/147; H10F 77/206
See application file for complete search history.

(56) References Cited

U.S. PATENT DOCUMENTS

2022/0238745 A1   7/2022 Toyonaka et al.

FOREIGN PATENT DOCUMENTS

| JP | 2019075479 A | 5/2019 |
| JP | 2022114411 A | 8/2022 |

*Primary Examiner* — Matthew L Reames
(74) *Attorney, Agent, or Firm* — Harrity & Harrity, LLP

(57) ABSTRACT

A semiconductor photodetector includes a substrate; a mesa structure on the substrate, the mesa structure being composed of some layers including an upper layer and a lower layer, the upper layer being an absorption layer of light, the lower layer being a wide bandgap layer with a bandgap wide enough not to absorb the light; and an insulating film covering a side of the mesa structure, each of the layers comprising single crystals of III-V semiconductors and having a top of a (100) plane, the top of the wide bandgap layer having a shape including a pair of vertices, in [0-11] and [01-1] directions, on a circumference of a minimum bounding circle.

20 Claims, 14 Drawing Sheets

SEMICONDUCTOR PHOTODETECTOR

CROSS-REFERENCE TO RELATED APPLICATIONS

This patent application claims priority to Japanese patent application number 2022-204354 filed on Dec. 21, 2022, and to Japanese patent application number 2023-017340 filed on Feb. 8, 2023, the contents of which are hereby incorporated by reference into this application.

TECHNICAL FIELD

The present disclosure relates generally to a semiconductor photodetector.

BACKGROUND

Increasing transmission speeds in optical communications require high-speed response of optical modules. A semiconductor photodetector with excellent high-speed response can be equipped with a circular truncated cone-shaped mesa structure that is comprised of some laminated semiconductor layers and is covered with an insulating film.

In some cases, the mesa structure can have a reverse circular truncated cone shape after crystal anisotropic etching is applied in a formation process, which makes a side reverse-tapered. This causes deteriorated coverage of the insulating film, and therefore leads to lower reliability and characteristics.

SUMMARY

Some implementations described herein ensure coverage of an insulating film.

In some implementations, a semiconductor photodetector includes: a substrate; a mesa structure on the substrate, the mesa structure being composed of some layers including an upper layer and a lower layer, the upper layer being an absorption layer of light, the lower layer being a wide bandgap layer with a bandgap wide enough not to absorb the light; and an insulating film covering a side of the mesa structure, each of the layers comprising single crystals of III-V semiconductors and having a top of a (100) plane, the top of the wide bandgap layer having a shape including a pair of vertices, in [0-11] and [01-1] directions, on a circumference of a minimum bounding circle.

DETAILED DESCRIPTION

Figure 1:
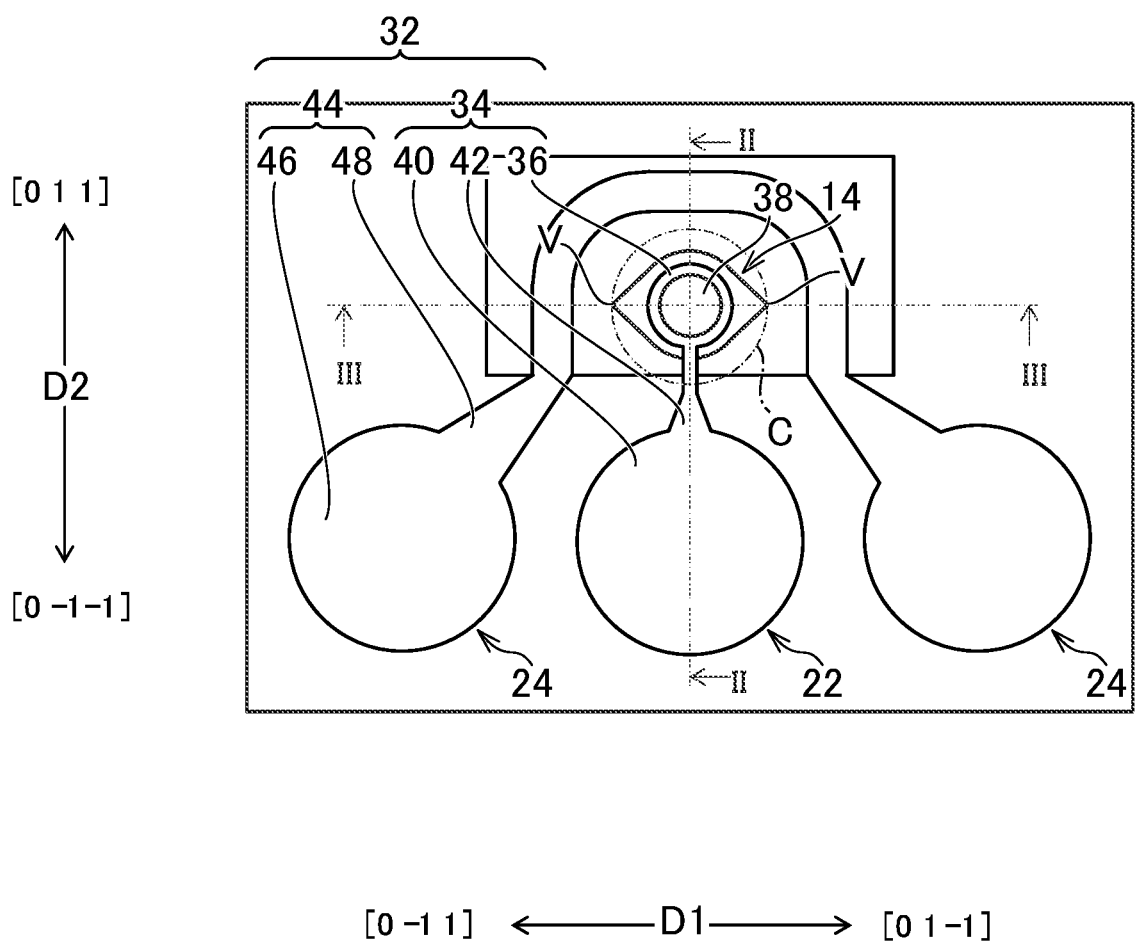
FIG. 1 is a plan view of a semiconductor photodetector in a first example implementation.

Some implementations are specifically described in detail in the following with reference to drawings. In the drawings, the same members are denoted by the same reference numerals and have the same or equivalent functions, and a repetitive description thereof may be omitted for the sake of simplicity. Note that, the drawings referred to in the following are only for illustrating the example implementations, and are not necessarily drawn to scale.

Figure 2:
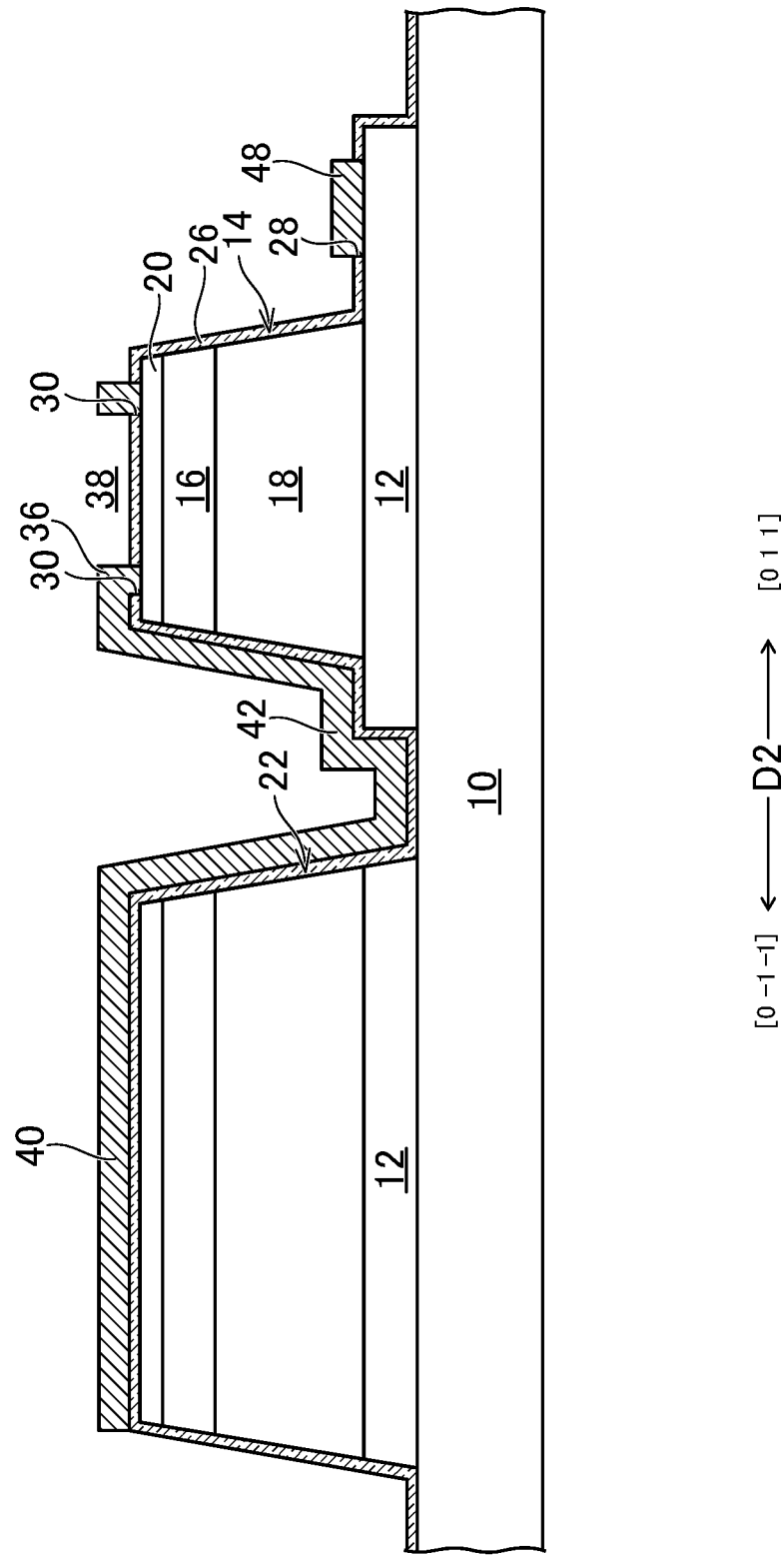
FIG. 2 is a II-II enlarged cross-sectional view of the semiconductor photodetector in FIG. 1.
Figure 3:
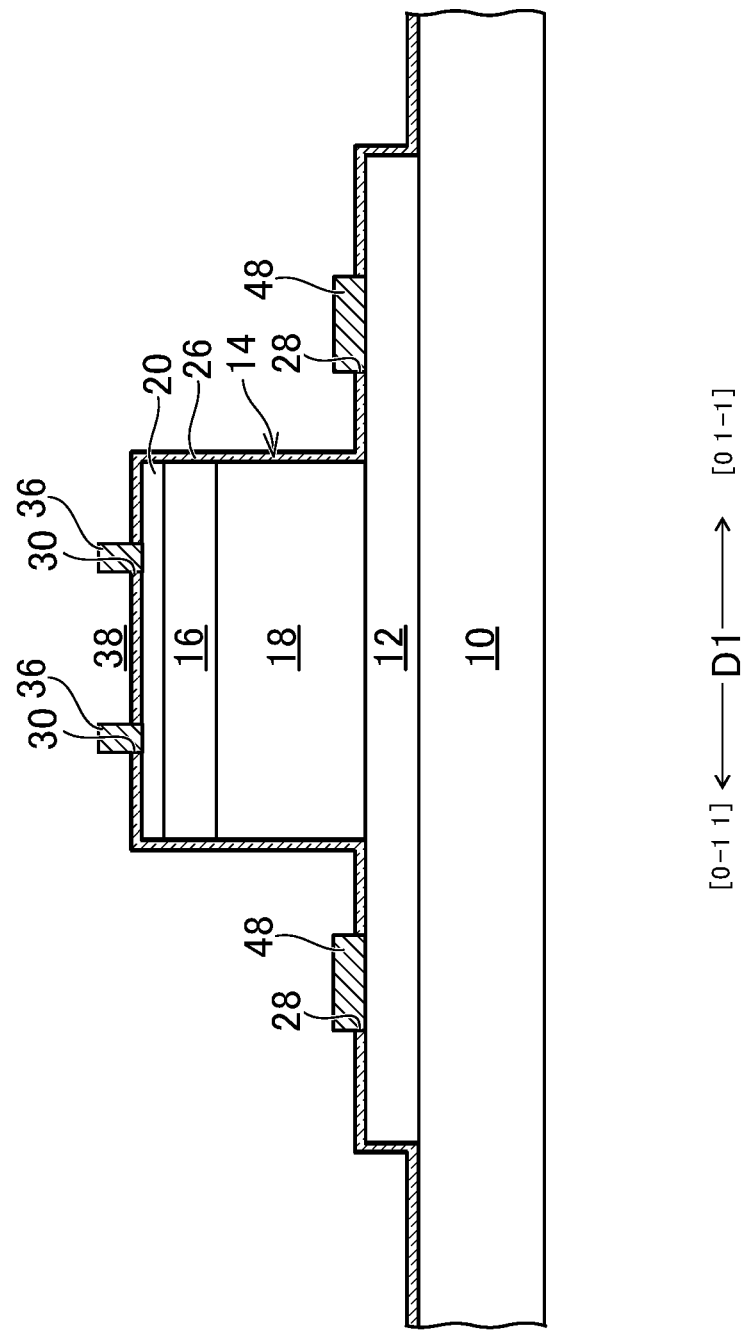
FIG. 3 is a III-III enlarged cross-sectional view of the semiconductor photodetector in FIG. 1.

FIG. 1 is a plan view of a semiconductor photodetector in a first example implementation. FIG. 2 is a II-II enlarged cross-sectional view of the semiconductor photodetector in FIG. 1. FIG. 3 is a III-III enlarged cross-sectional view of the semiconductor photodetector in FIG. 1.

The semiconductor photodetector supports wavelength bands commonly used in optical communications. The semiconductor photodetector may be a top illuminated semiconductor photodetector (e.g., where signal light impinges a top of the semiconductor photodetector), such as a PIN-type photodetector with a structure in which an intrinsic semiconductor layer is disposed between p-type and n-type semiconductor layers, or an avalanche photodiode (APD).

The semiconductor photodetector may have a substrate 10. The substrate 10 may comprise single crystals of III-V semiconductors (e.g., Fe-doped InP) and may have a top associated with a (100) plane as expressed by a Miller index. A first contact layer 12 may be on the substrate 10. The first contact layer 12 may be a semiconductor layer of a first conductivity type (e.g., n-type).

The semiconductor photodetector may have a mesa structure 14 on the substrate 10. The signal light may be incident on the top of the mesa structure 14. The mesa structure 14 may be on the substrate 10 (specifically on the first contact layer 12). The mesa structure 14 may be in contact with and electrically connected to the first contact layer 12.

The mesa structure 14 may comprise layers. Each layer may comprise single crystals of III-V semiconductors and may have a top associated with a (100) plane. The layers include an upper layer and a lower layer. The upper layer is not a bottom layer but may be a top layer.

The upper layer of the mesa structure 14 may be an absorption layer 16 of light. The absorption layer 16 may comprise InGaAs. Light incident on the mesa structure 14 may enter the absorption layer 16, may be absorbed there, and may be converted into electricity. The absorption layer 16 may be capable of converting signal light into electrical signals. The absorption layer 16 may be either an intrinsic semiconductor layer or a conductive semiconductor layer, or a combination of both. The intrinsic semiconductor may have no polarity (e.g., may be semiconductor that intentionally contains no additives to give it polarity, such that the semiconductor contains trace amounts of additives only at background levels).

The top of the absorption layer 16 may have a shape including a pair of vertices V, in [0-11] and [01-1] directions (mutually opposite along a first direction D1), on a circumference of a minimum bounding circle C. An angle at each vertex V may be 135 degrees or less. The vertex V may include not only a point where tips of two straight lines meet but also a point where two curved lines meet.

The top of the absorption layer 16 may have a shape including a pair of tips, in [011] and [0-1-1] directions (mutually opposite along a second direction D2 perpendicular to the first direction D1), inside the minimum bounding circle C. The top of the absorption layer 16 may have a shape including a pair of arcs convex in the [011] and [0-1-1] directions (second direction D2), respectively.

The lower layer of the mesa structure 14 may be a wide bandgap layer 18 and may have a bandgap wide enough not to absorb light. The wide bandgap layer 18 may have a wider bandgap than the absorption layer 16 and may not absorb light transmitted through the absorption layer 16 (e.g., incoming light). The wide bandgap layer 18 may be an intrinsic semiconductor and may comprise any one of InAlGaAs, InAlAs, and InP.

The wide bandgap layer 18 may be thicker than the absorption layer 16. The wide bandgap layer 18 and the absorption layer 16 may deplete when a voltage is applied, forming a depletion layer. The wide bandgap layer 18 can make the depletion layer thicker, thereby reducing parasitic capacitance and enabling high-speed operation.

The top of the wide bandgap layer 18 may have a shape including a pair of vertices V, in the [0-11] and [01-1] directions (direction D1), on the circumference of the minimum bounding circle C. An angle at each vertex V may be 135 degrees or less.

In a process of forming the mesa structure 14, a semiconductor layer may be grown crystalline and etched through a mask. Due to crystal orientation dependence of the etching, a crystal plane appears and a side in the first direction D1 may be reverse tapered. If the mask is circular in a planar shape, another side, in a direction slightly off from the first direction D1, may be also reverse tapered, making wider reverse tapered surfaces.

In this example implementation, since the planar shape may have the vertices V in the first direction D1, a side slightly off from the first direction D1 may be also a forward tapered surface or a vertical surface. Also due to this effect, the side in the first direction D1 may not be a reverse tapered surface but a vertical shape or a forward taper surface. Even if the vertex V is an intersection point of two curves, no reverse tapered surface may appear because the side in the first direction D1 may be small.

The top of the wide bandgap layer 18 may have a shape including a pair of tips, in the [011] and [0-1-1] directions (second direction D2), inside the minimum bounding circle C. The capacitance of the semiconductor photodetector may be proportional to an area of the depleted layer, enabling area reduction of the mesa structure 14 in plan view to suppress increase in parasitic capacitance, enabling support for high-speed operation.

The top of the wide bandgap layer 18 may have a shape including a pair of arcs convex in the [011] and [0-1-1] directions (second direction D2), respectively. The top of the wide bandgap layer 18 coincides in shape with a bottom of the absorption layer 16.

The top layer of the layers may be a second contact layer 20, may have a bandgap wide enough not to absorb incident light, and may be a semiconductor layer (e.g., InGaAs layer) of a second conductivity type (e.g., p-type).

The top of the second contact layer 20 may have a shape including a pair of vertices V, in the [0-11] and [01-1] directions (direction D1), on the circumference of the minimum bounding circle C. An angle at each vertex V may be 135 degrees or less.

The top of the second contact layer 20 may have a shape including a pair of tips, in the [011] and [0-1-1] directions (second direction D2), inside the minimum bounding circle C. The top of the second contact layer 20 may have a shape including a pair of arcs convex in the and [0-1-1] directions (second direction D2), respectively. The bottom of the second contact layer 20 may coincide in shape with the top of the absorption layer 16.

In this example implementation, the layers included in the mesa structure 14 consist of only the minimum required elements, but additional layer may be included. For example, the layers may include an etch stop layer between the first contact layer 12 and the wide bandgap layer 18, or an InAlGaAs cap layer between the absorption layer 16 and the second contact layer 20.

The first projection structure 22 may be provided above the substrate 10. The first projection structure 22 may comprise some layers and may have the same layer structure as the mesa structure 14 except that the bottom layer may be the same layer as the first contact layer 12. However, planar shapes may be different.

The second projection structure 24 may be provided above the substrate 10. The second projection structure 24 may have the same layer structure as the first projection structure 22. The mesa structure 14, the first projection structure 22, and the second projection structure 24 may be formed by growing the layer structures described above using molecular beam epitaxy (MBE) equipment and then separating each using lithography technology.

The semiconductor photodetector may have an insulating film 26 covering a side of the mesa structure 14. The insulating film 26 covers and protects exposed surfaces (e.g., entirely) of the mesa structure 14, the first projection structure 22, the second projection structure 24, and the substrate 10. The insulating film 26 may be a passivation film, and may be an oxide film or a nitride film (e.g., a silicon oxide film or a silicon nitride film). The insulating film 26 may not be formed on part of the top of the first contact layer 12, whereby a first through-hole 28 may be formed. The insulating film 26 may not be formed on part of the top of the mesa structure 14, whereby a second through-hole 30 may be formed.

The insulating film 26 (passivation film) may protect the semiconductor composing the mesa structure 14 and reduce leakage current. In this example implementation, the side of the mesa structure 14 may not be reverse tapered, so the insulating film 26 may have good coverage and the semiconductor photodetector may have high reliability and characteristics.

The semiconductor photodetector may have an electrode pattern 32. The electrode pattern 32 may include a first electrode 34. The first electrode 34 may be disposed on one side of the substrate 10. Parts of the first electrode 34 may be integral.

The first electrode 34 may include a mesa electrode 36 on the top of the mesa structure 14. The top of the mesa electrode 36 may be circular in shape but may be in line with the shape of the mesa structure 14. The second through-hole 30 in the insulating film 26 connects the mesa electrode 36 and the second contact layer 20. The mesa electrode 36 may be in contact with (physically and electrically connected to) the top of the second contact layer 20. The mesa electrode 36 may have an opening 38 in plan view. The opening 38 may be shaped to allow signal light to enter. The opening 38 may be circular. The mesa electrode 36 may have a ring shape in plan view but may have a partially unconnected C-shape.

The first electrode 34 may include a first external electrode 40 (e.g., pad). The first external electrode 40 may be positioned to cover the top of the first projection structure 22, for an unillustrated wire to be bonded, to make an electrical connection to the outside (e.g., transimpedance amplifier). The first external electrode 40 may be on the insulating film 26.

The first electrode 34 may include a first connection electrode 42 that connects the first external electrode 40 and the mesa electrode 36. The first connection electrode 42 may be narrower, in width perpendicular to an extension direction, than either the first external electrode 40 or the mesa electrode 36. The first connection electrode 42 may extend from the mesa electrode 36 in the [011] or [0-1-1] direction (second direction D2). The side of the mesa structure 14 may be forward tapered in this direction, thus preventing breaking of the first connection electrode 42.

The electrode pattern 32 may include a second electrode 44. The second electrode 44 may be located on one side of the substrate 10. Parts of the second electrode 44 may be integral. The second electrode 44 may include a pair of second external electrodes 46. The first external electrode 40 may be between the pair of second external electrodes 46. The second external electrode 46 may include a region (e.g., a pad) located on the top of the second projection structure 24 and a region on a side of the second projection structure 24. The second electrode 44 may include a second connection electrode 48 that connects the pair of second external electrodes 46. The second connection electrode 48 may be in contact with the first contact layer 12, inside the first through-hole 28 in the insulating film 26. By applying a voltage between the first electrode 34 and the second electrode 44, light (e.g., optical signals) incident on the mesa structure 14 may be absorbed and electrical signals may be obtained.

Figure 4:
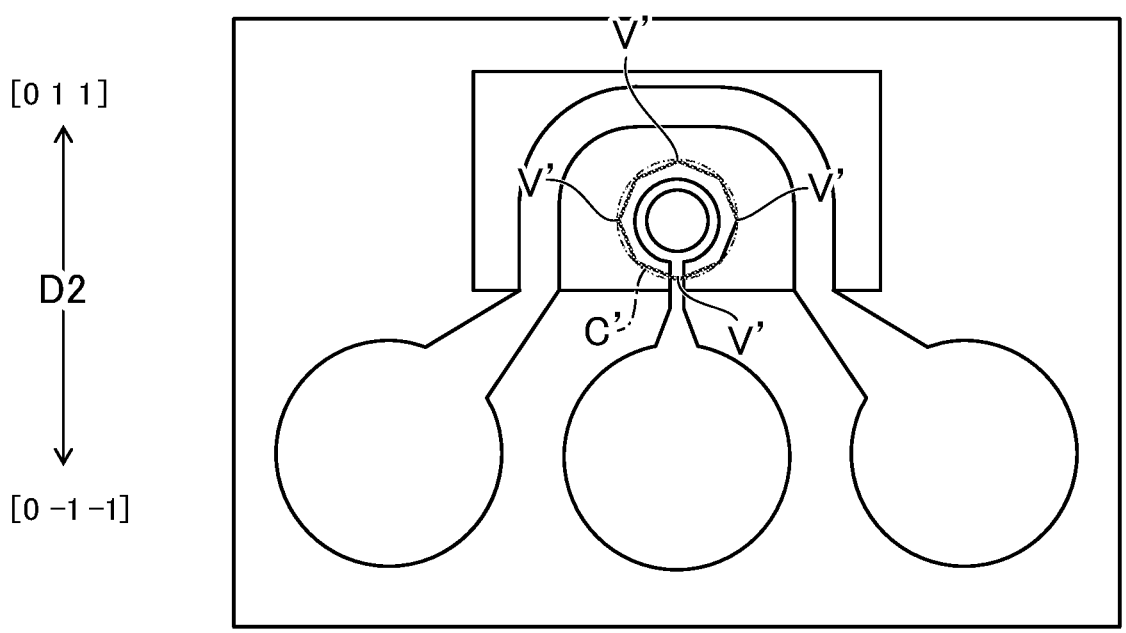
FIG. 4 is a plan view of a semiconductor photodetector in a modification of the first example implementation.

FIG. 4 is a plan view of a semiconductor photodetector in a modification of the first example implementation. The top of the wide bandgap layer 18 may have a shape including a pair of vertices V', in the [011] and [0-1-1] directions (second direction D2), on a circumference of a minimum bounding circle C'. The top of the wide bandgap layer 18 may be polygonal (e.g., regular octagon).

Thus, the top may be shaped as a combination of straight lines only. An angle (formed by two straight lines) θ at the vertex V' may be 135 degrees or less. If the angle is larger, the top becomes almost circular in shape and a reverse tapered surface may appear.

The top of a layer (top layer, absorption layer 16) above the wide bandgap layer 18 may have a shape including a pair of vertices V', in the [0-11] and [01-1] directions (direction D1), on the circumference of the minimum bounding circle C'. The top of the wide bandgap layer 18 coincides in shape with the bottom of the absorption layer 16.

Figure 5:
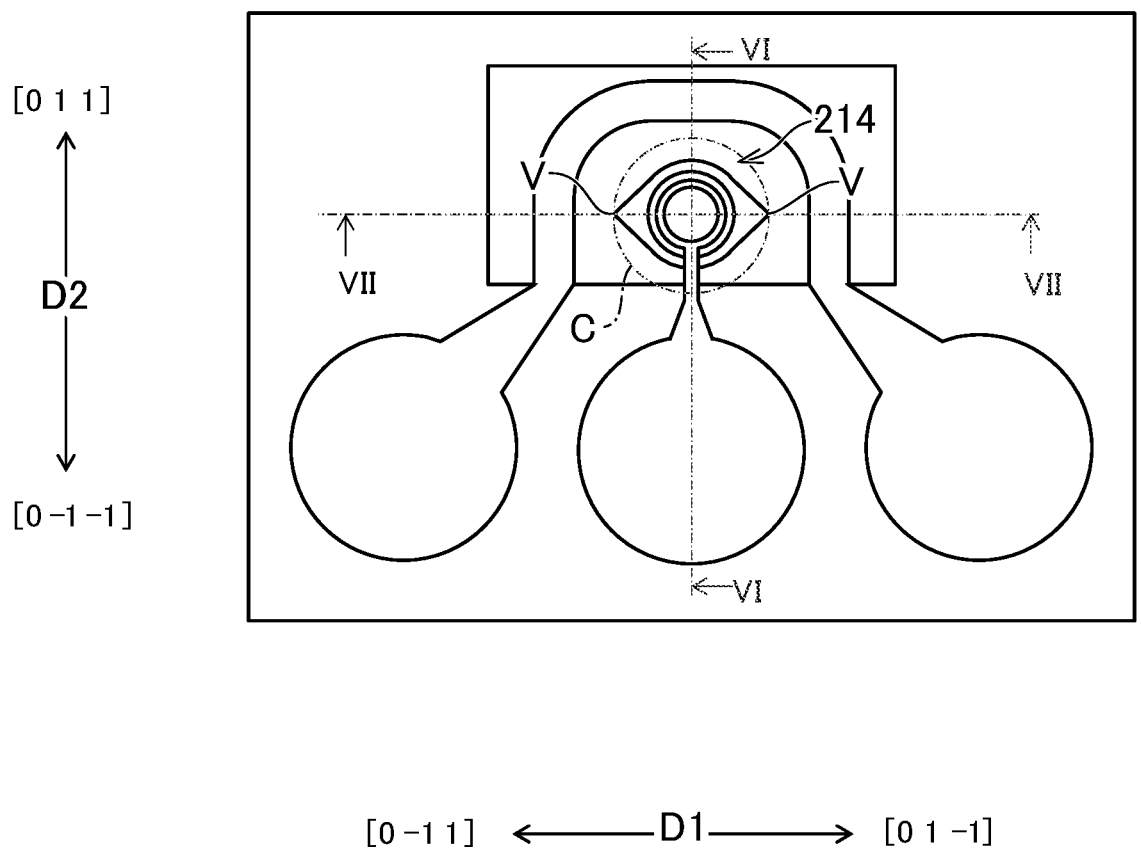
FIG. 5 is a plan view of the semiconductor photodetector in a second example implementation.
Figure 6:
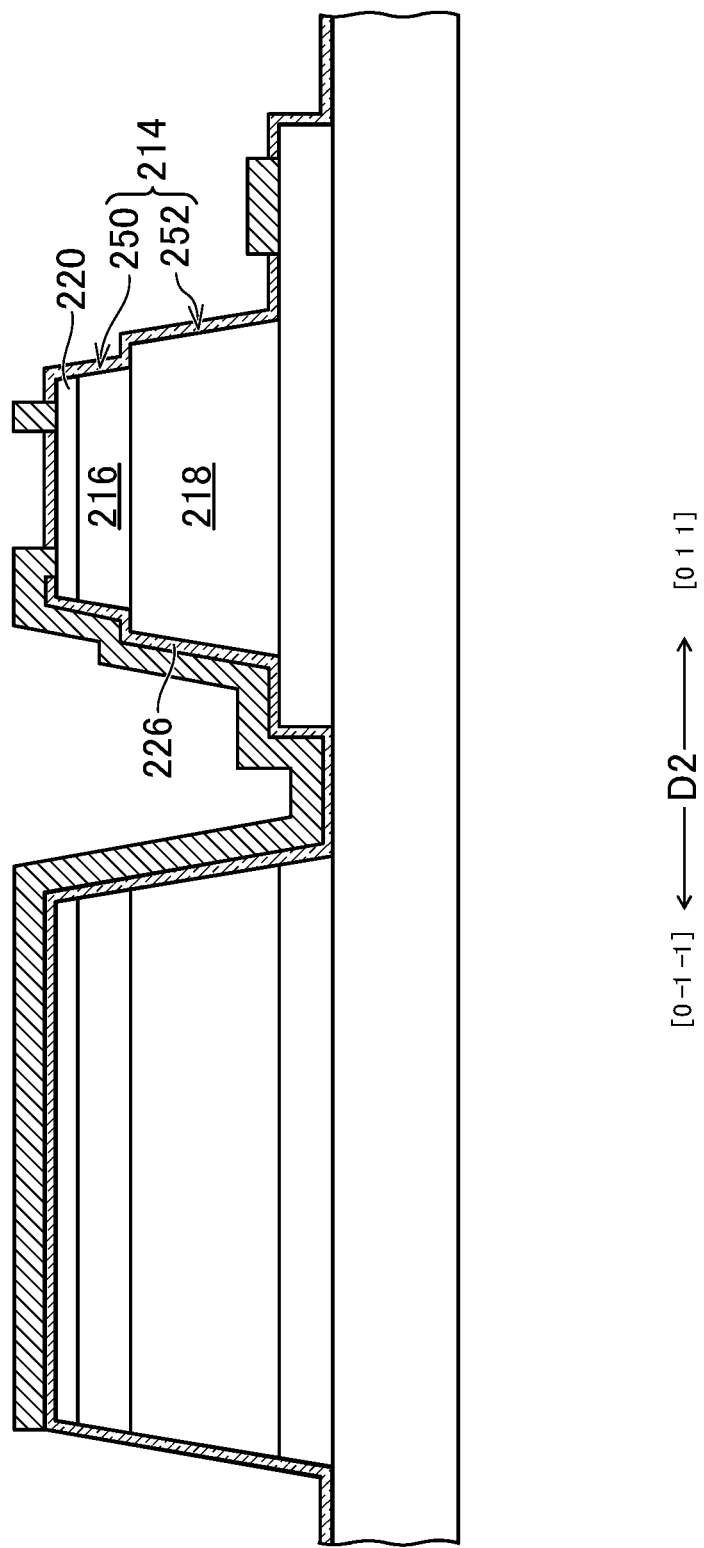
FIG. 6 is a VI-VI enlarged cross-sectional view of the semiconductor photodetector in FIG. 5.
Figure 7:
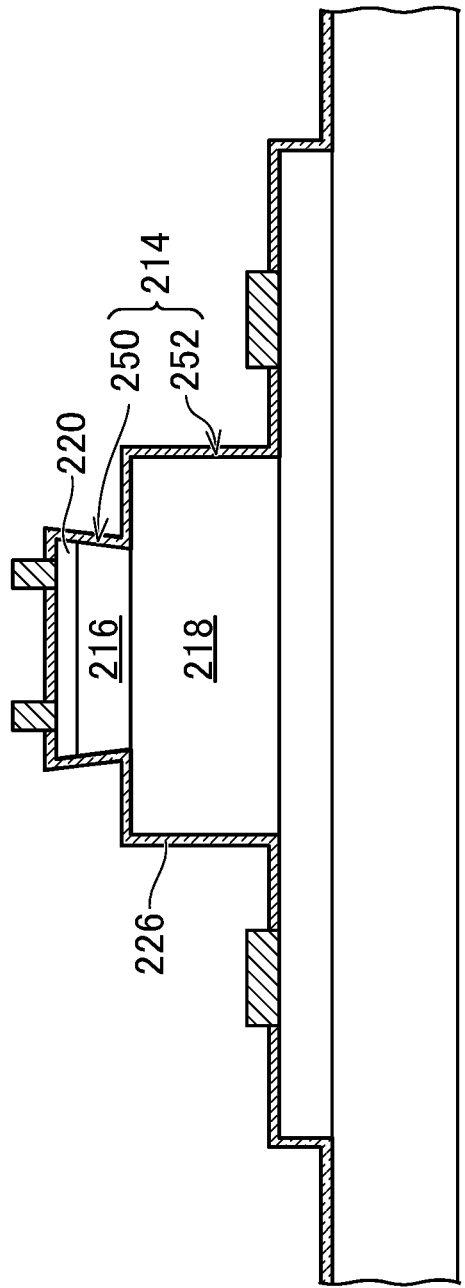
FIG. 7 is a VII-VII enlarged cross-sectional view of the semiconductor photodetector in FIG. 5.

FIG. 5 is a plan view of the semiconductor photodetector in a second example implementation. FIG. 6 is a VI-VI enlarged cross-sectional view of the semiconductor photodetector in FIG. 5. FIG. 7 is a VII-VII enlarged cross-sectional view of the semiconductor photodetector in FIG. 5.

The mesa structure 214 may have a two-stage structure that may include an upper mesa structure 250 and a lower mesa structure 252. The upper mesa structure 250 may include an absorption layer 216 and a second contact layer 220. The lower mesa structure 252 may include a wide bandgap layer 218.

The top of the upper mesa structure 250 may be circular. That is, the top of a layer (top layer, absorption layer 216) above the wide bandgap layer 218 may be circular. Therefore, the side of the upper mesa structure 250 may include a reverse tapered surface. The top of the wide bandgap layer 218 protrudes from the absorption layer 216.

The capacitance of the semiconductor photodetector may be proportional to the area of the layer to be depleted, and the beam shape of the incident light may be generally circular. Therefore, to ensure light-receiving efficiency and avoid adding unnecessary capacitance, the area of the depleting layer may be circular. The depleted layers may be the absorption layer 216 and the wide bandgap layer 218, which may be included in the upper mesa structure 250 and the lower mesa structure 252, respectively.

However, if the tops of both the upper mesa structure 250 and the lower mesa structure 252 are made circular, sides of both become reverse tapered, having a significant impact on the coverage of the insulating film 226. A first solution to address this issue may be the first example implementation, but when the top is larger than the beam shape of the incident light, it may be non-optimal from a capacitance view point.

Therefore, in this example implementation, the top of the lower mesa structure 252 may have the same shape as the top of the wide bandgap layer 218 while the top of the upper mesa structure 250 may be circular to reduce an increase in capacitance. This reduces a possibility of poorer coverage of the insulating film 226, since the reverse tapered surface appears but not on the side of the lower mesa structure 252.

The wide bandgap layer 218 may be a layer placed to reduce capacitance and tends to be thicker than other layers (e.g., absorption layer 216). The top of the lower mesa structure 252, including the wide bandgap layer 218, may not be circular in shape, because if the side of the thick layer become reverse tapered, the coverage of the insulating film 226 may deteriorate.

The depletion layer may have a thickness limited by impurity concentration; the lower the impurity concentration, the thicker the depletion layer. In other words, if a certain impurity contained, the thickness of the depletion layer may be effectively limited, no matter how thick the layer is formed.

Since the impurity concentration may be lower in InP than in InAlGaAs, the depletion layer formed from InP may be effectively thicker than the layer formed from InAlGaAs. Therefore, when the wide bandgap layer 218 is formed thicker from InP, the depletion region may be correspondingly wider. Forming the wide bandgap layer 218 thick results in a wide reverse tapered surface and poor coverage of the insulating film 226, but according to this example implementation, the coverage of the insulating film 226 can also be ensured. For other points, the contents described in the first example implementation may be applied.

Figure 8:
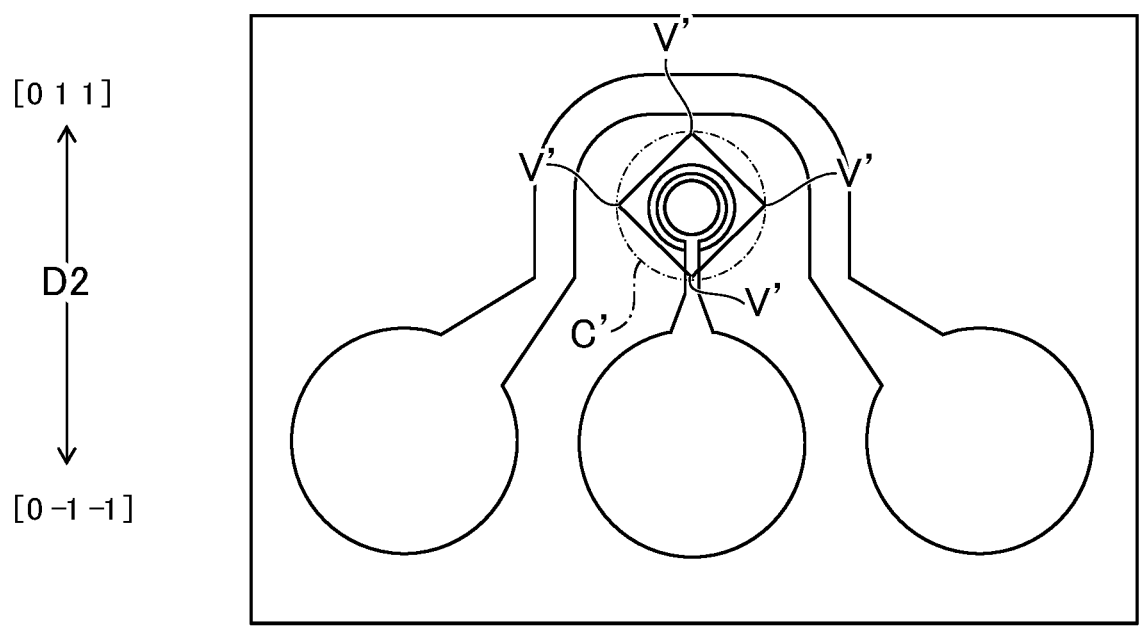
FIG. 8 is a plan view of a semiconductor photodetector in a modification of the second example implementation.

FIG. 8 is a plan view of a semiconductor photodetector in a modification of the second example implementation. The top of the wide bandgap layer 218 may have a shape including a pair of vertices V', in the [011] and [0-1-1] directions (second direction D2), on the circumference of the minimum bounding circle C'. The top of the wide bandgap layer 218 may be polygonal (e.g., rhombic or regular octagonal).

Other aspects may be the same as in the second example implementation. The top of the wide bandgap layer 218 may have a shape including a pair of vertices V', in the [0-11] and

[01-1] directions (direction D1), on the circumference of the minimum bounding circle C'. The top of a layer (top layer, absorption layer 216) above the wide bandgap layer 218 may be circular. The top of the wide bandgap layer 218 may protrude from the absorption layer 216.

Figure 9:
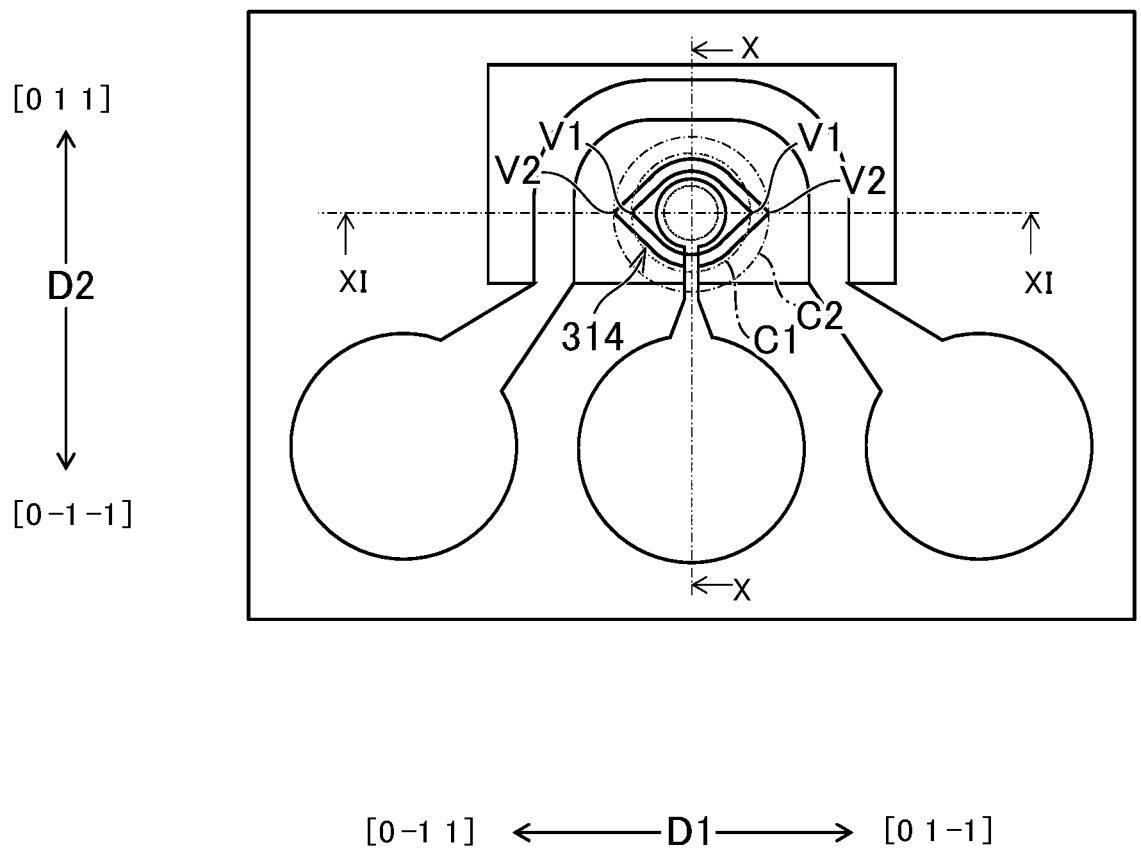
FIG. 9 is a plan view of a semiconductor photodetector in a third example implementation.
Figure 10:
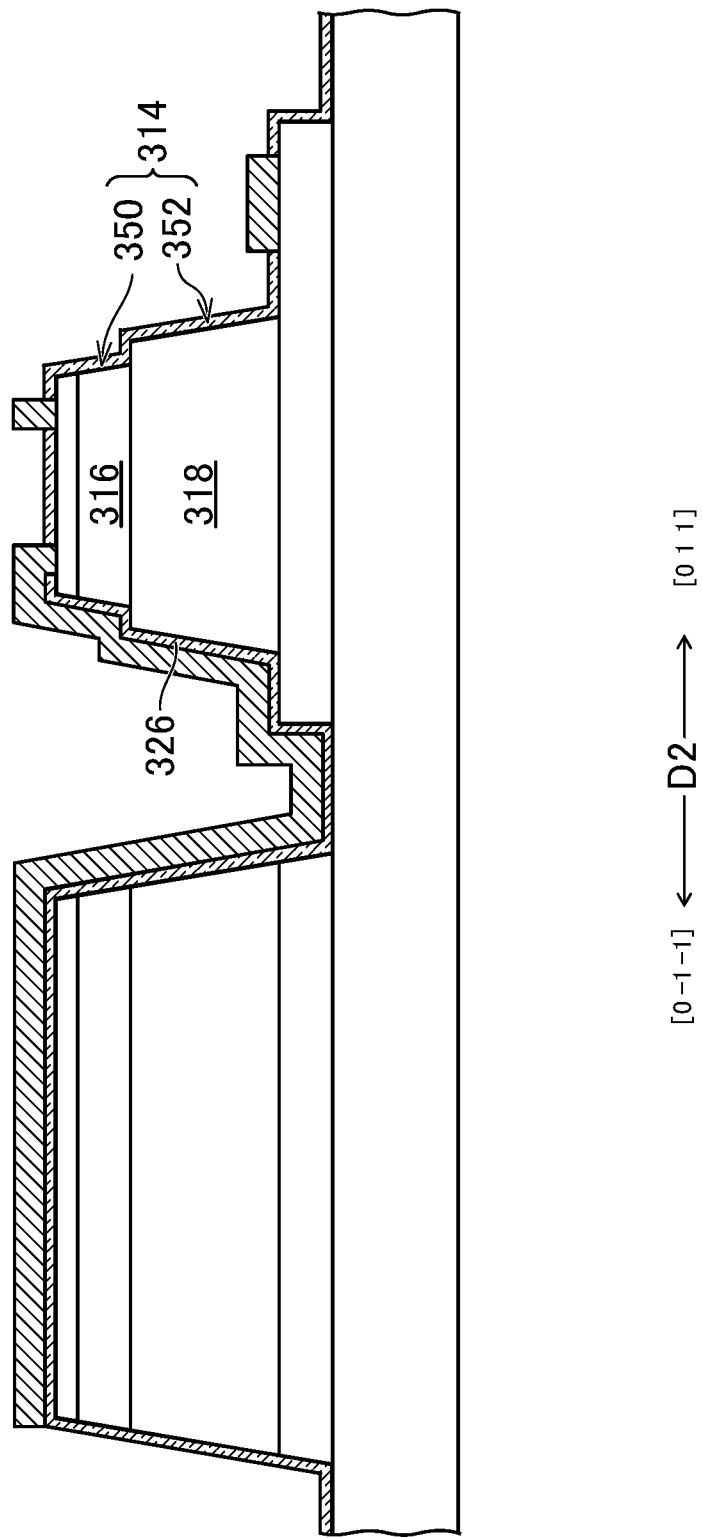
FIG. 10 is a X-X enlarged cross-sectional view of the semiconductor photodetector in FIG. 9.
Figure 11:
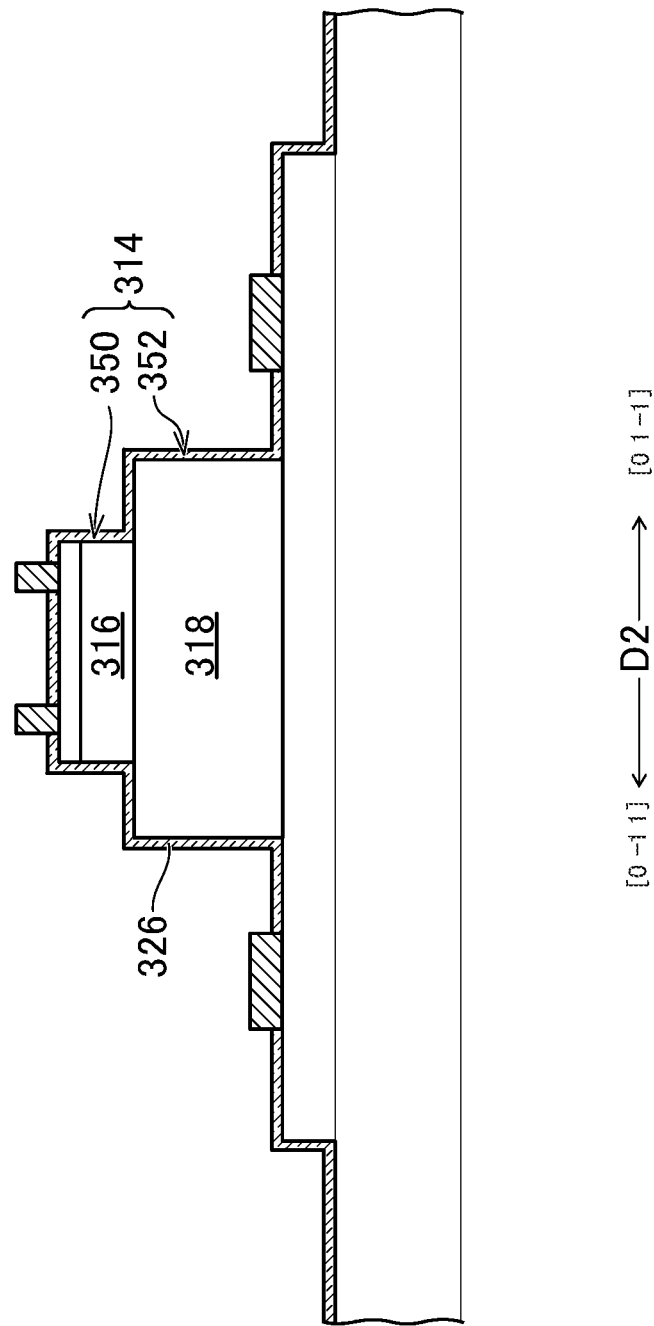
FIG. 11 is an XI-XI enlarged cross-sectional view of the semiconductor photodetector in FIG. 9.

FIG. 9 is a plan view of a semiconductor photodetector in a third example implementation. FIG. 10 is a X-X magnified cross-sectional view of the semiconductor photodetector in FIG. 9. FIG. 11 is an XI-XI enlarged cross-sectional view of the semiconductor photodetector in FIG. 9.

The mesa structure 314 may have a two-stage structure that may include an upper mesa structure 350 and a lower mesa structure 352. The top of the wide bandgap layer 318 may protrude from the absorption layer 316. The top of the upper mesa structure 350 and the top of the lower mesa structure 352 may be similar in shape, although they may be different in size. Alternatively, they may have different shapes; for example, the top of the upper mesa structure 350 may be rhombic and the top of the lower mesa structure 352 may be octagonal.

The top of the upper mesa structure 350 may not be circular but may have vertices in the first direction D1. In detail, the top of a layer (top layer, absorption layer 316) above the wide bandgap layer 318 may have a shape including a pair of vertices V1, in the [0-11] and [01-1] directions (direction D1), on the circumference of the minimum bounding circle C1. Therefore, the side of the upper mesa structure 350 may include no reverse tapered surface, leading to excellent coverage of the insulating film 326.

In other respects, the description in the first example implementation may be applied. The top of the wide bandgap layer 318 may have a shape including a pair of vertices V2, in the [0-11] and [01-1] directions (direction D1), on the circumference of the minimum bounding circle C2.

Figure 12:
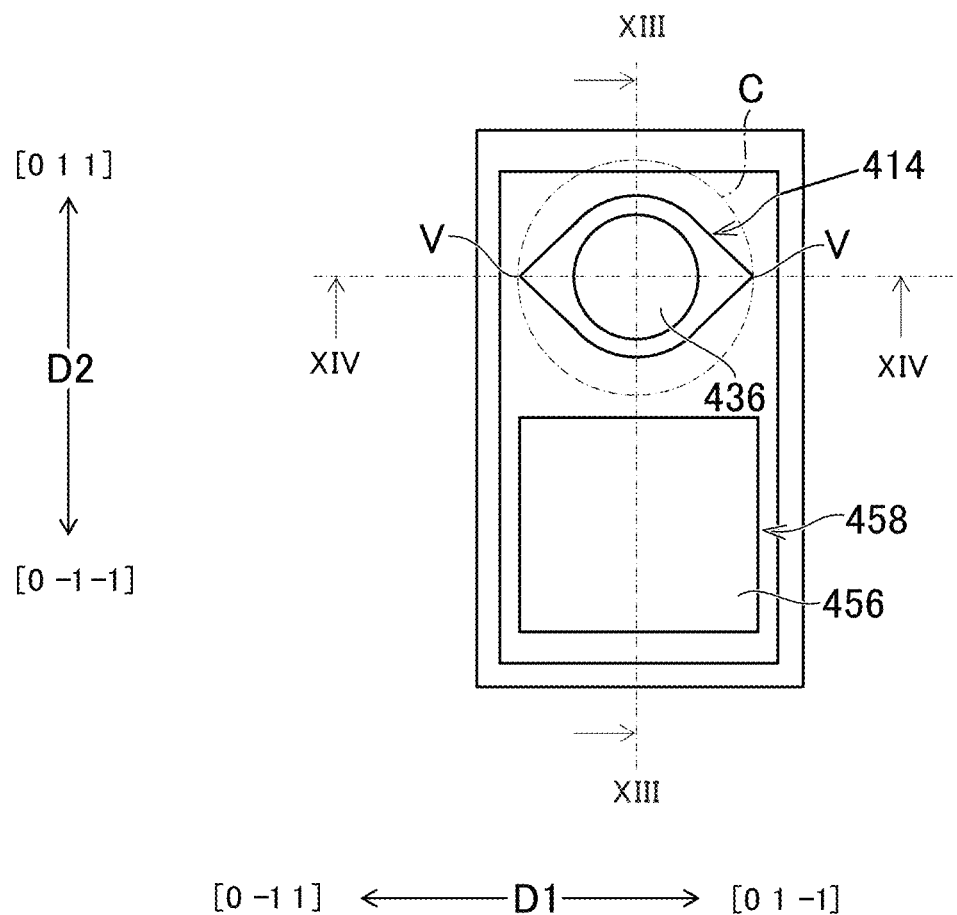
FIG. 12 is a plan view of a semiconductor photodetector in a fourth example implementation.
Figure 13:
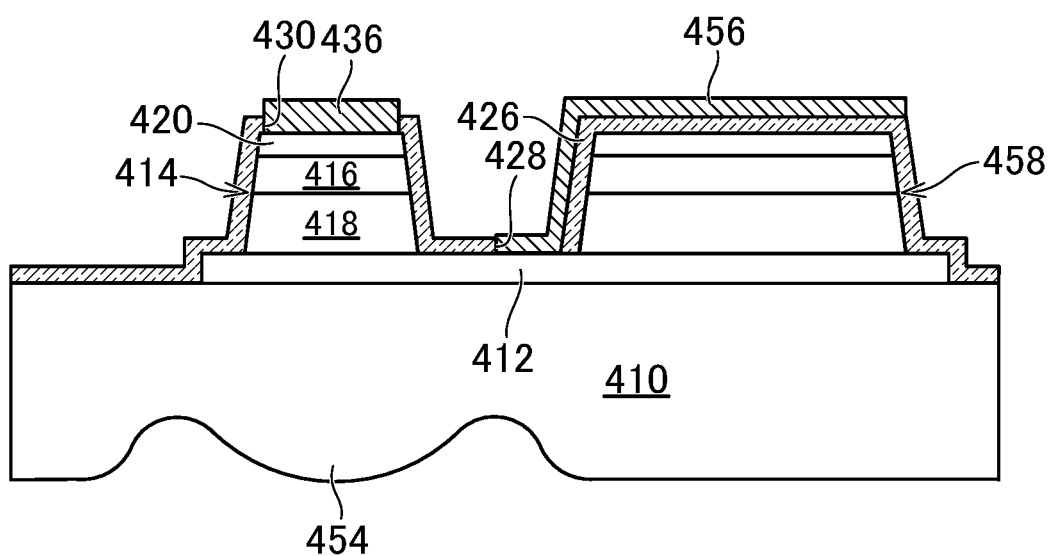
FIG. 13 is a XIII-XIII enlarged cross-sectional view of the semiconductor photodetector in FIG. 12.
Figure 14:
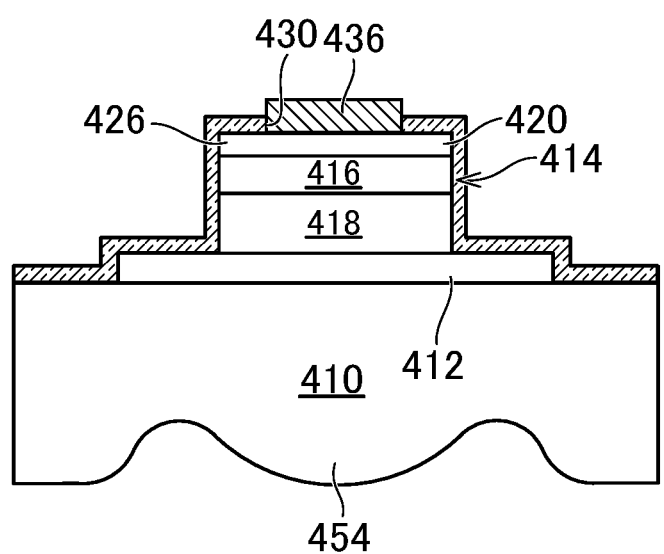
FIG. 14 is a XIV-XIV enlarged cross-sectional view of the semiconductor photodetector in FIG. 12.

FIG. 12 is a plan view of a semiconductor photodetector in a fourth example implementation. FIG. 13 is a XIII-XIII enlarged cross-sectional view of the semiconductor photodetector in FIG. 12. FIG. 14 is a XIV-XIV enlarged cross-sectional view of the semiconductor photodetector in FIG. 12.

The substrate 410 may be shaped to allow signal light to enter from an opposite side to the mesa structure 414. A lens 454 may be formed on the back of the substrate 410. The lens 454 may be capable of collecting light incident from the outside. The semiconductor photodetector may be a back illuminated semiconductor photodetector in which signal light is incident on the back. In other respects, the description in the first example implementation may be applied.

A first contact layer 412 may be provided on the top of the substrate 410. The first contact layer 412 may be a semiconductor layer of the first conductivity type (e.g., n-type). The mesa structure 414 may be disposed on the top (specifically first contact layer 412) of the substrate 410. The mesa structure 414 may be in contact with and electrically connected to the first contact layer 412.

Light incident on the mesa structure 414 enters the absorption layer 416 and may be absorbed there to be converted into electricity. The absorption layer 416 may be either an intrinsic semiconductor layer or a semiconductor layer of conductive type, or a combination of both. Here, the absorption layer 416 may comprise InGaAs.

The wide bandgap layer 418 may have a wider bandgap than the absorption layer 416, being a semiconductor layer with a bandgap wide enough not to absorb incoming light. The wide bandgap layer 418 may comprise intrinsic semiconductor, which may be InAlGaAs but may also be InP.

The second contact layer 420 may be an InGaAs layer, which may be a semiconductor layer of the second conductivity type (e.g., p-type). A depletion layer may be created in the wide bandgap layer 418 and the absorption layer 416 when a voltage is applied. The wide bandgap layer 418 makes the depletion layer thicker, reducing parasitic capacitance, enabling support for high-speed operation.

The projection structure 458 may have the same layer structure as the mesa structure 414. The mesa structure 414 and the projection structure 458 may be formed by growing the layer structures described above using molecular beam epitaxy (MBE) equipment and then separating each using lithography technology.

The insulating film 426 covers and protects exposed surfaces (e.g., entirely) of the mesa structure 414, the projection structure 458, and the first contact layer 412. The insulating film 426 may be a passivation film and may be an oxide film or a nitride film, e.g., a silicon oxide film or a silicon nitride film. The insulating film 426 may have a first through-hole 428 in part of the top of the first contact layer 412. The insulating film 426 may have a second through-hole 430 in part of the top of the mesa structure 414.

The semiconductor photodetector may have an external electrode 456. The external electrode 456 may be arranged to cover the top and part of the side of the projection structure 458. The external electrode 456 and the first contact layer 412 may be connected to each other at the first through-hole 428 in the insulating film 426.

The semiconductor photodetector may have a mesa electrode 436. The mesa electrode 436 may be arranged in a circular shape on part of the top of the mesa structure 414. The mesa electrode 436 and the second contact layer 420 may be connected to each other at the second through-hole 430 in the insulating film 426.

The mesa structure 414 may have a shape including vertices V in the first direction D1 in plan view. The top of the mesa structure 414 may have a shape including a pair of vertices V, in the [0-11] and [01-1] directions, on the circumference of the minimum bounding circle C. The mesa structure 414 may have no vertex V in the second direction D2 and may have an arc shape.

Also in this example implementation, no reverse tapered surface may be formed on the side of the mesa structure 414, improving coverage of the insulating film 426 covering the side of the mesa structure 414, whereby reliability may be ensured. Furthermore, the wide bandgap layer 418 may be optionally thick, enabling support for high-speed operation.

As a modification, the top of a layer (top layer, absorption layer 416) above the wide bandgap layer 418 may be circular to make the mesa structure 414 a two-stage structure. Alternatively, the top of the wide bandgap layer 418 may have a shape of a combination of a straight line and an arc or may have a shape of a polygon such as an octagon or a rhombus.

The embodiments described above are not limited, and different variations are possible. The structures explained in the embodiments may be replaced with substantially the same structures and other structures that can achieve the same effect or the same objective.

In a first implementation, a semiconductor photodetector includes: a substrate 10; a mesa structure 14 on the substrate 10, the mesa structure 14 comprising layers including an upper layer and a lower layer, the upper layer being an absorption layer 16 of light, the lower layer being a wide bandgap layer 18 with a bandgap wide enough not to absorb the light; and an insulating film 26 covering a side of the mesa structure 14, each of the layers comprising single crystals of III-V semiconductors and having a top associated with a (100) plane, the top of the wide bandgap layer 18 having a shape including a pair of vertices V, in [0-11] and [01-1] directions, on a circumference of a minimum bounding circle C.

The pair of vertices V, in the [0-11] and [01-1] directions, impede formation of a reverse tapered surface, ensuring coverage of the insulating film 26.

In a second implementation, alone or in combination with the first implementation, an angle at each of the pair of vertices V is 135 degrees or less.

In a third implementation, alone or in combination with one or more of the first and second implementations, the top of the wide bandgap layer 18 has a shape including a pair of tips, in [011] and [0-1-1] directions, inside the minimum bounding circle C.

In a fourth implementation, alone or in combination with one or more of the first through third implementations, the top of the wide bandgap layer 18 has a shape including a pair of arcs convex in the [011] and [0-1-1] directions, respectively.

In a fifth implementation, alone or in combination with one or more of the first through fourth implementations, the top of the wide bandgap layer 18 has a shape including a pair of vertices V', in [011] and [0-1-1] directions, on the circumference of the minimum bounding circle C'.

In a sixth implementation, alone or in combination with one or more of the first through fifth implementations, the top of the wide bandgap layer 18 is polygonal.

In a seventh implementation, alone or in combination with one or more of the first through sixth implementations, the top of a layer above the wide bandgap layer 18 has a shape including a pair of vertices V, in the [0-11] and [01-1] directions, on a circumference of a minimum bounding circle C.

In an eighth implementation, alone or in combination with one or more of the first through seventh implementations, the top of the wide bandgap layer 18 coincides in shape with a bottom of the absorption layer 16.

In a ninth implementation, alone or in combination with one or more of the first through eighth implementations, the top of a layer above the wide bandgap layer 218 is circular.

In a tenth implementation, alone or in combination with one or more of the first through ninth implementations, the top of the wide bandgap layer 218 protrudes from the absorption layer 216.

In an eleventh implementation, alone or in combination with one or more of the first through tenth implementations, the semiconductor photodetector further includes an electrode pattern 32, the electrode pattern 32 including a mesa electrode 36 on a top of the mesa structure 14.

In a twelfth implementation, alone or in combination with one or more of the first through eleventh implementations, the electrode pattern 32 further includes a connection electrode connected to the mesa electrode 36, and the connection electrode extends in a [011] direction or a [0-1-1] direction.

In a thirteenth implementation, alone or in combination with one or more of the first through twelfth implementations, the mesa electrode 36 includes an opening 38 in plan view.

In a fourteenth implementation, alone or in combination with one or more of the first through thirteenth implementations, the opening 38 is shaped to allow signal light to enter.

In a fifteenth implementation, alone or in combination with one or more of the first through fourteenth implementations, the opening 38 is circular.

In a sixteenth implementation, alone or in combination with one or more of the first through fifteenth implementations, the mesa electrode 36 is ring-shaped in plan view.

In a seventeenth implementation, alone or in combination with one or more of the first through sixteenth implementations, the substrate 410 is shaped to allow signal light to enter from an opposite side to the mesa structure 414.

In an eighteenth implementation, alone or in combination with one or more of the first through seventeenth implementations, the wide bandgap layer 18 is thicker than the absorption layer 16.

In an nineteenth implementation, alone or in combination with one or more of the first through eighteenth implementations, the wide bandgap layer 18 comprises any one of InAlGaAs, InAlAs, and InP.

In a twentieth implementation, alone or in combination with one or more of the first through nineteenth implementations, the absorption layer 16 comprises InGaAs.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A semiconductor photodetector comprising:
a substrate;
a mesa structure on the substrate, the mesa structure comprising layers including an upper layer and a lower layer, the upper layer being an absorption layer of light, the lower layer being a wide bandgap layer with a bandgap wide enough not to absorb the light; and
an insulating film covering a side of the mesa structure,
each of the layers comprising single crystals of III-V semiconductors and having a top associated with a (100) plane,
the top of the wide bandgap layer having a shape including a pair of vertices, in [0-11] and [01-1] directions, on a circumference of a minimum bounding circle.

2. The semiconductor photodetector according to claim 1, wherein an angle at each of the pair of vertices is 135 degrees or less.

3. The semiconductor photodetector according to claim 1, wherein the top of the wide bandgap layer has a shape including a pair of tips, in [011] and [0-1-1] directions, inside the minimum bounding circle.

4. The semiconductor photodetector according to claim 3, wherein the top of the wide bandgap layer has a shape including a pair of arcs convex in the [011] and [0-1-1] directions, respectively.

5. The semiconductor photodetector according to claim 1, wherein the top of the wide bandgap layer has a shape including a pair of vertices, in [011] and [0-1-1] directions, on the circumference of the minimum bounding circle.

6. The semiconductor photodetector according to claim 5, wherein the top of the wide bandgap layer is polygonal.

7. The semiconductor photodetector according to claim 1, wherein the top of a layer above the wide bandgap layer has a shape including a pair of vertices, in the [0-11] and [01-1] directions, on a circumference of a minimum bounding circle.

8. The semiconductor photodetector according to claim 1, wherein the top of the wide bandgap layer coincides in shape with a bottom of the absorption layer.

9. The semiconductor photodetector according to claim 1, wherein the top of a layer above the wide bandgap layer is circular.

10. The semiconductor photodetector according to claim 1, wherein the top of the wide bandgap layer protrudes from the absorption layer.

11. The semiconductor photodetector according to claim 1, further comprising an electrode pattern, the electrode pattern including a mesa electrode on a top of the mesa structure.

12. The semiconductor photodetector according to claim 11, wherein:
the electrode pattern further includes a connection electrode connected to the mesa electrode, and
the connection electrode extends in a [011] direction or a [0-1-1] direction.

13. The semiconductor photodetector according to claim 11, wherein the mesa electrode includes an opening in plan view.

14. The semiconductor photodetector according to claim 13, wherein the opening is shaped to allow signal light to enter.

15. The semiconductor photodetector according to claim 14, wherein the opening is circular.

16. The semiconductor photodetector according to claim 15, wherein the mesa electrode is ring-shaped in plan view.

17. The semiconductor photodetector according to claim 1, wherein the substrate is shaped to allow signal light to enter from an opposite side to the mesa structure.

18. The semiconductor photodetector according to claim 1, wherein the wide bandgap layer is thicker than the absorption layer.

19. The semiconductor photodetector according to claim 1, wherein the wide bandgap layer comprises any one of InAlGaAs, InAlAs, and InP.

20. The semiconductor photodetector according to claim 1, wherein the absorption layer comprises InGaAs.

* * * * *